US010603696B2

(12) United States Patent
Ogihara et al.

(10) Patent No.: US 10,603,696 B2
(45) Date of Patent: *Mar. 31, 2020

(54) PROCESS FOR MANUFACTURING RESIST COMPOSITION AND PATTERNING PROCESS

(71) Applicant: SHIN-ETSU CHEMICAL CO., LTD., Tokyo (JP)

(72) Inventors: Tsutomu Ogihara, Jyoetsu (JP); Motoaki Iwabuchi, Jyoetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 471 days.

This patent is subject to a terminal disclaimer.

(21) Appl. No.: 14/632,208

(22) Filed: Feb. 26, 2015

(65) Prior Publication Data
US 2015/0286143 A1 Oct. 8, 2015

(30) Foreign Application Priority Data
Apr. 3, 2014 (JP) .................................... 2014-76653

(51) Int. Cl.
G03F 7/075 (2006.01)
B08B 9/032 (2006.01)
(Continued)

(52) U.S. Cl.
CPC ............ B08B 9/032 (2013.01); B01D 61/14 (2013.01); B08B 3/04 (2013.01); B08B 3/08 (2013.01);
(Continued)

(58) Field of Classification Search
CPC ... G03F 7/0757; G03F 7/0755; C09D 183/04; C09D 183/06; C08L 83/04; C08G 77/04;
(Continued)

(56) References Cited

U.S. PATENT DOCUMENTS 4,770,977 A * 9/1988 Buiguez ............... G03F 7/0758
216/47
4,886,728 A * 12/1989 Salamy ................. G03F 7/162
427/240
(Continued)

FOREIGN PATENT DOCUMENTS

EP 1 867 681 A1 12/2007
EP 2500775 9/2012
(Continued)

OTHER PUBLICATIONS

Wu et al., Improving Advanced Lithography Process Defectivity with a Highly retentive 5nm Asymmetric UPE Filter, Entegris, INC., pp. 1-6 (2009).*
(Continued)

Primary Examiner — Amanda C. Walke
(74) Attorney, Agent, or Firm — Oliff PLC

(57) ABSTRACT

This is to provide a process for manufacturing a resist composition which can prepare a resist composition lowered in coating defects, and
the manufacturing process is a process for manufacturing a resist composition to be used in a process for manufacturing a semiconductor apparatus, the process comprising the steps of:
cleaning a manufacturing apparatus for a resist composition with a cleaning solution;
analyzing the cleaning solution taken out from the manufacturing apparatus;
repeating the step of cleaning and the step of analyzing until a concentration of metal components contained in the cleaning solution becomes 5 ppb or less; and
manufacturing the resist composition by using the manufacturing apparatus after the step of repeating.

20 Claims, 2 Drawing Sheets

(51) Int. Cl.
H01L 21/311 (2006.01)
H01L 21/3213 (2006.01)
C09D 183/04 (2006.01)
C08G 77/04 (2006.01)
B01D 61/14 (2006.01)
G03F 7/16 (2006.01)
G03F 7/20 (2006.01)
G03F 7/11 (2006.01)
G03F 7/039 (2006.01)
G03F 7/09 (2006.01)
G03F 7/32 (2006.01)
H01L 21/027 (2006.01)
B08B 3/04 (2006.01)
B08B 3/08 (2006.01)
C11D 11/00 (2006.01)
B08B 9/02 (2006.01)

(52) U.S. Cl.
CPC ............... B08B 9/02 (2013.01); C08G 77/04 (2013.01); C09D 183/04 (2013.01); C11D 11/0047 (2013.01); G03F 7/0397 (2013.01); G03F 7/0752 (2013.01); G03F 7/091 (2013.01); G03F 7/094 (2013.01); G03F 7/11 (2013.01); G03F 7/16 (2013.01); G03F 7/2041 (2013.01); G03F 7/325 (2013.01); H01L 21/0271 (2013.01); H01L 21/31116 (2013.01); H01L 21/31138 (2013.01); H01L 21/31144 (2013.01); H01L 21/32139 (2013.01)

(58) Field of Classification Search
CPC .... B01D 61/14; B01D 61/145; B01D 61/147; B01D 61/22; B01D 61/18; C07C 67/29; C07C 67/76
USPC ................ 430/270.1, 271.1, 272.1; 427/387; 428/447; 524/588, 860; 528/10, 25, 27, 528/31, 32, 43; 560/100; 562/88; 522/182
See application file for complete search history.

(56) References Cited

U.S. PATENT DOCUMENTS

| | | | | |
|---|---|---|---|---|
| 5,151,219 A * | 9/1992 | Salamy | G03F 7/162 | 252/364 |
| 5,685,327 A * | 11/1997 | Mohindra | B08B 3/10 | 134/102.3 |
| 5,814,433 A * | 9/1998 | Nelson | G03F 7/162 | 430/192 |
| 5,847,905 A * | 12/1998 | Inaba | G11B 15/62 | 360/128 |
| 6,758,908 B2 * | 7/2004 | Whitman | H01L 21/312 | 118/696 |
| 6,884,462 B2 * | 4/2005 | Whitman | H01L 21/312 | 257/E21.259 |
| 8,048,615 B2 * | 11/2011 | Takei | G03F 7/0752 | 430/272.1 |
| 8,426,111 B2 * | 4/2013 | Takei | G03F 7/091 | 156/273.3 |
| 8,835,102 B2 * | 9/2014 | Ogihara | C08L 83/04 | 430/322 |
| 8,906,452 B1 * | 12/2014 | Hillman | G03F 7/162 | 118/320 |
| 9,207,535 B2 * | 12/2015 | Ogihara | C09D 183/06 | |
| 2001/0041769 A1 * | 11/2001 | Iwasawa | C07F 7/0852 | 524/588 |
| 2003/0200996 A1 * | 10/2003 | Hiatt | B08B 1/00 | 134/21 |
| 2006/0191854 A1 * | 8/2006 | Sakillaris | G03F 7/0382 | 210/746 |
| 2008/0023046 A1 * | 1/2008 | Restelli | B01D 29/01 | 134/33 |
| 2008/0153040 A1 * | 6/2008 | Honda | G03F 7/423 | 430/319 |
| 2009/0253884 A1 * | 10/2009 | Ogawa | C08G 77/06 | 528/10 |
| 2010/0167212 A1 * | 7/2010 | Cho | G03F 7/11 | 430/313 |
| 2010/0297551 A1 * | 11/2010 | Teranishi | C08F 220/18 | 430/270.1 |
| 2012/0129352 A1 * | 5/2012 | Mori | B82Y 10/00 | 438/703 |
| 2012/0184103 A1 | 7/2012 | Ogihara et al. | | |
| 2013/0108958 A1 | 5/2013 | Ogihara et al. | | |
| 2013/0302990 A1 | 11/2013 | Watanabe et al. | | |
| 2014/0054738 A1 * | 2/2014 | Yamamoto | C09D 183/04 | 257/432 |
| 2014/0148536 A1 * | 5/2014 | Kawabata | C07F 7/21 | 524/101 |
| 2014/0335453 A1 * | 11/2014 | Ogihara | C08L 83/04 | 430/270.1 |
| 2015/0099216 A1 * | 4/2015 | Iwabuchi | G03F 7/0752 | 430/30 |
| 2015/0166941 A1 * | 6/2015 | Sassa | C11D 11/0047 | 438/778 |
| 2016/0027653 A1 | 1/2016 | Tachibana et al. | | |

FOREIGN PATENT DOCUMENTS

| | | | |
|---|---|---|---|
| JP | 2001-125277 A | | 5/2001 |
| JP | 2004-053886 A | | 2/2004 |
| JP | 2004053888 A | * | 2/2004 |
| JP | 2007-072357 A | | 3/2007 |
| JP | 2007072138 A | * | 3/2007 |
| JP | 4716037 B2 | | 7/2011 |
| JP | 2012-145897 A | | 8/2012 |
| JP | 2013-092686 A | | 5/2013 |
| JP | 2013-112705 A | | 6/2013 |
| JP | 2013-137869 A | | 7/2013 |
| JP | 2013-253227 A | | 12/2013 |
| JP | 2014-024831 A | | 2/2014 |
| WO | 2011/125326 A1 | | 10/2011 |

OTHER PUBLICATIONS

Machine translation of JP 2004-053888 (no date).*
Machine translation of JP 2007-072138 (no date).*
Mar. 3, 2016 extended European Search Report issued in Application No. 15000794.6.
Jul. 18, 2017 Office Action issued in Japanese Application No. 2014-076653.
Feb. 14, 2017 Office Action issued in Japanese Patent Application No. 2014-076653.
Jan. 30, 2018 Office Action issued in Japanese Application No. 2014-76653.
Aug. 14, 2018 Office Action issued in Japanese Application No. 2014-76653.
Oct. 8, 2019 Office Action issued in Japanese Patent Application No. 2018-204438.

* cited by examiner

PROCESS FOR MANUFACTURING RESIST COMPOSITION AND PATTERNING PROCESS

BACKGROUND OF THE INVENTION

Field of the Invention

The present invention relates to a process for manufacturing a resist composition to be used for fine processing in a process for manufacturing a semiconductor apparatus including a semiconductor device, etc., in particular, to a process for manufacturing a composition for forming a resist film (a resist composition) to be used for a multi-layer resist method, and a patterning process using a resist composition manufactured by the process for manufacturing a resist composition.

Description of the Related Art

Accompanying with high integration and high speed acceleration of an LSI, miniaturization of a circuit pattern size is rapidly progressing. The lithography technology has achieved formation of a fine pattern by shortening wavelength of the light source and selecting an appropriate resist composition thereto, which are to conform to the miniaturization.

However, in the case where miniaturization is performed with the same light source, when the miniaturization is performed with the same film thickness of the photoresist film to be used, i.e., when a pattern width is made smaller, the aspect ratio of the photoresist pattern after development becomes large, and pattern collapse occurs as a result. Thus, the photoresist film thickness has been thinned accompanied by the miniaturization so that the aspect ratio of the photoresist pattern is in an appropriate range. However, due to thinning of the photoresist film, the problem further generated that precision of pattern transfer to a substrate to be processed is lowered.

One of the methods for solving the above-mentioned problems is multilayer resist method. In this method, an under layer film having etching selectivity different from that of a photoresist film, i.e. a resist upper layer film, is interposed between the resist upper layer film and a substrate to be processed, then a pattern is formed on the resist upper layer film, then the pattern is transferred to the under layer film by etching using the upper layer resist pattern as an etching mask, and further the pattern is transferred to the substrate to be processed by etching using the under layer film as an etching mask.

In a silicon-containing resist under layer film or an organic under layer film to be used in such a multi-layer resist method, metal impurities derived from an environment, an apparatus, an equipment and starting materials are generally contained. In the patterning process using the multi-layer resist method, pattern transfer using dry etching is repeatedly carried out, so that such metal impurities become an etching mask under dry etching conditions and are transferred to a body to be processed for a semiconductor apparatus. Thus, when a semiconductor apparatus is manufactured by using the substrate, it shows electrical abnormality such as open abnormality, short-circuit abnormality, etc., in the circuit, which is one of reasons in lowering yield of semiconductor apparatuses. At present, for preventing from the defect, purification of the starting materials is said to be the most effective way and, for example, a method is disclosed in Patent Document 1 that the starting polymer can be purified by contacting with an acidic aqueous solution. However, in the resist composition to be used in the most advanced process which is required to perform fine processing, etc., it is not sufficient only by purification of the polymer.

PRIOR ART DOCUMENTS

Patent Documents

Patent Document 1: WO 2011/125326

SUMMARY OF THE INVENTION

The present invention was made in view of the above situation, and has an object to provide a process for manufacturing a resist composition capable of producing a resist composition whose coating defects are reduced.

To solve the above-mentioned problems, the present invention provides a process for manufacturing a resist composition which is used in a manufacturing process of a semiconductor apparatus, comprising the steps of:

cleaning a manufacturing apparatus for a resist composition with a cleaning solution;

analyzing the cleaning solution taken out from the manufacturing apparatus;

repeating the step of cleaning and the step of analyzing until a concentration of metal components contained in the cleaning solution becomes 5 ppb or less; and manufacturing the resist composition by using the manufacturing apparatus after the step of repeating.

If the concentration of the metal components contained in the manufacturing apparatus for manufacturing a resist does not become low, a resist composition having a low content of metal components, i.e., a resist composition with low defects cannot be manufactured. If the step of cleaning is repeated until the concentration of the metal components in the cleaning solution which has been used for cleaning a manufacturing apparatus become 5 ppb or less, it is possible to prepare a resist composition in which coating defects derived from the metal components can be lowered.

At this time, the concentration of the metal components is preferably calculated by using any of an inductively coupled plasma mass spectrometer, an inductively coupled plasma atomic emission spectrometer and an atomic absorption spectrometer in analyzing the cleaning solution.

When analysis of the cleaning solution is performed by using such an analytical apparatus, the metal components in the cleaning solution can be detected with excellent sensitivity, and the concentration thereof can be calculated accurately.

Also, it is preferred that the step of cleaning is performed until a total concentration of iron, chromium and nickel among the metal components contained in the cleaning solution becomes 2 ppb or less.

Among the metal components contained in the cleaning solution, those which mostly affect to generation of defects in the etching process may be mentioned iron, chromium and nickel, and by making the amounts of these metal components little, it can be ensured as a manufacturing apparatus for a resist composition in which etching defects at the etching process can be more lowered.

At this time, it is preferred that an organic resist composition having an aromatic compound as a repeating unit is used as the resist composition.

Among these, it is preferred that the aromatic compound contains at least one of a phenol derivative, a naphthalene derivative, a naphthol derivative, an anthracene derivative and a pyrene derivative.

In addition, it is also preferred that the organic resist composition contains a compound obtained by reacting a phenol derivative, a naphthol derivative or both of them with an aldehyde derivative, and a solvent.

The resist composition to be manufactured by the manufacturing process of the present invention may be mentioned the organic resist composition having the structure as mentioned above.

At this time, it is preferred that a silicon-containing resist composition is used as the resist composition.

Also, it is preferred that the silicon-containing resist composition contains a polysiloxane.

Further, it is preferred that a silicon content in the silicon-containing resist composition is 10% by weight or more.

The resist composition to be manufactured by the manufacturing process of the present invention may be mentioned the silicon-containing resist composition having the structure as mentioned above.

Also, the present invention provides a patterning process for forming a pattern on a body to be processed using a resist composition manufactured by the above-mentioned process for manufacturing a resist composition, the patterning process comprising:

forming an organic under layer film on a body to be processed using an organic resist composition manufactured by the manufacturing process;

forming a silicon-containing resist under layer film on the organic under layer film using a silicon-containing resist composition manufactured by the manufacturing process;

forming a resist upper layer film on the silicon-containing resist under layer film;

forming a pattern to the resist upper layer film; subjecting to pattern transfer to the silicon-containing resist under layer film using the resist upper layer film to which the pattern has been formed as a mask;

subjecting to pattern transfer to the organic under layer film using the silicon-containing resist under layer film to which the pattern has been transferred as a mask; and subjecting to pattern transfer to the body to be processed using the organic under layer film to which the pattern has been transferred as a mask.

In such a patterning process, pattern transfer is carried out using a resist composition in which coating defects have been lowered, so that even when a fine pattern is processed, the etching defects can be lowered, and yield in manufacturing a semiconductor apparatus can be improved.

At this time, it is preferred that the resist composition manufactured by the above-mentioned process for manufacturing a resist composition is used as the organic resist composition.

When the patterning process using such an organic resist composition is employed, a semiconductor apparatus with good yield can be manufactured.

It is also preferred that the resist composition manufactured by the above-mentioned process for manufacturing a resist composition is used as the silicon-containing resist composition.

When the patterning process using such a silicon-containing resist composition is employed, a semiconductor apparatus with good yield can be manufactured.

At this time, it is preferred that the body to be processed is a semiconductor substrate or a material in which any of a metal film, a metal carbide film, a metal oxide film, a metal nitride film, a metal oxycarbide film or a metal oxynitride film is formed as a film on the semiconductor substrate.

It is also preferred that a metal constituting the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

In the present invention, a pattern can be formed by using these materials as a body to be processed.

When the process for manufacturing a resist composition of the present invention is employed, a resist composition lowered in coating defects can be manufactured. The resist composition thus manufactured can subject to pattern transfer without etching defects when transfer is carried out using an etching process. Accordingly, it can be suitably used in the multi-layer resist method, in particular, in liquid immersion exposure, double patterning, organic solvent development, etc., and finally, yield in manufacturing a semiconductor apparatus can be improved.

DETAILED DESCRIPTION OF THE PREFERRED EMBODIMENTS

Figure 1:
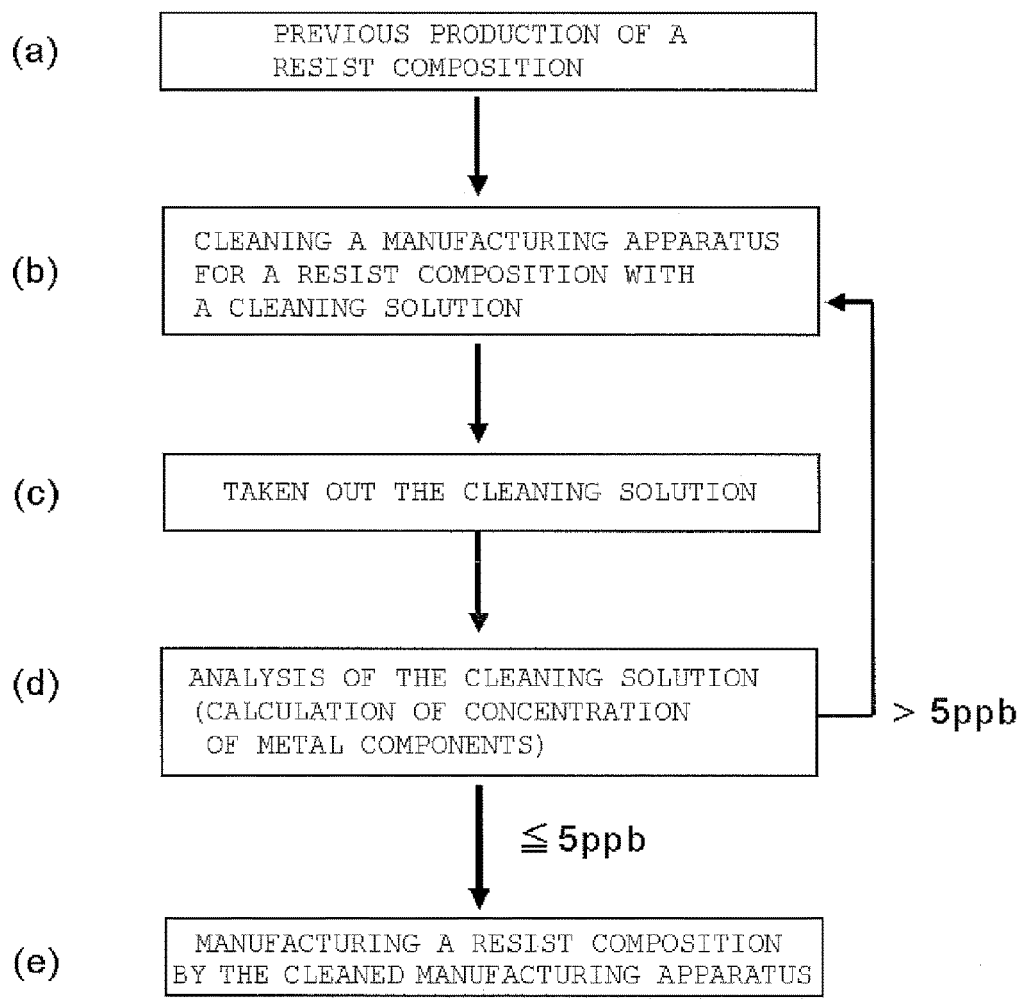
FIG. 1 is a flow chart showing an example of the process for manufacturing a resist composition of the present invention.

In recent years, miniaturization of a circuit pattern of a semiconductor apparatus is further advanced, miniaturization of an upper layer resist pattern is also progressed, and as the performances required for the silicon-containing resist under layer film or the organic under layer film used in the multi-layer resist process, a coating film with less defects in etching than the conventional ones has been required.

The present inventors have earnestly studied the origin of metal impurities contained in a resist film which cause etching defects, and as a result, they have clarified that metal impurities derived from not only raw materials of a resist composition but also derived from environment and manufacturing apparatus can cause the etching defects in many cases. When a coating film is formed, the metal impurities cause coating defects, and are transferred to a semiconductor substrate as the etching defects by dry etching. When a semiconductor apparatus is manufactured by using the substrate, it shows electric abnormality such as open abnormality, short-circuit abnormality, etc., in the circuit, which is one of reasons in lowering yield of semiconductor apparatuses. Thus, the present inventors have investigated to reduce such defects, and as a result, they have found that if the manufacturing apparatus is cleaned until an amount of metal components in the cleaning solution used for cleaning the manufacturing apparatus becomes a certain amount or less during manufacturing a resist composition, then, it is possible to prepare a resist composition which can stably form a resist film with less coating defects, whereby they have accomplished the present invention.

That is, the present invention relates to a process for manufacturing a resist composition which is used in a manufacturing process of a semiconductor apparatus, comprising the steps of: cleaning a manufacturing apparatus for a resist composition with a cleaning solution; analyzing the cleaning solution taken out from the manufacturing apparatus; repeating the step of cleaning and the step of analyzing until a concentration of metal components contained in the cleaning solution becomes 5 ppb or less; and manufacturing the resist composition by using the manufacturing apparatus after the step of repeating.

In the following, the present invention is explained by referring to the drawings.

FIG. 1 is a flow chart showing an example of the process for manufacturing a resist composition of the present invention.

Figure 2:
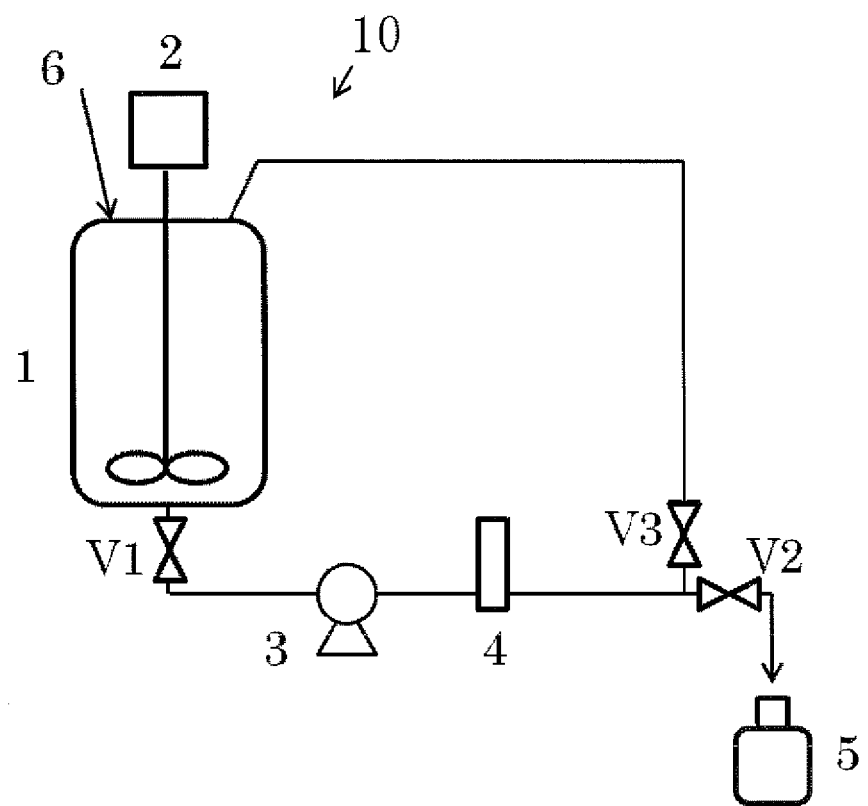
FIG. 2 is a schematic drawing showing an example of a manufacturing apparatus for the resist composition used in the present invention.

First, in step (a), manufacture of a resist composition is previously carried out by a manufacturing apparatus 10 as shown in FIG. 2.

The manufacturing apparatus 10 comprises a preparation tank 1 equipped with a stirrer 2 and a feeding port 6; a liquid feeding pump 3 connected from the preparation tank 1 through a pipe having a tank valve V1; a filtering machine 4 filtrating a cleaning solution or a resist composition sent out from the liquid feeding pump 3; and a draw-off valve V2 for feeding the resist composition filtrated by the filtering machine 4 to a product container 5, and further a circulation valve V3 for circulating a cleaning solution fed from the feeding port 6 of the preparation tank 1 at the time of cleaning and a pipe for feeding the cleaning solution. Specifically, at the filtering machine 4, a filter for manufacturing may be installed for the purpose of removing alien substances, or a filter for manufacturing and a filter for cleaning may be different.

In the manufacturing apparatus 10 after a resist composition has been previously manufactured in the step (a), there remains a residual liquid from the previous production and metal components derived from the manufacturing apparatus or an environment.

Next, in step (b), cleaning of the manufacturing apparatus 10 is carried out with a cleaning solution. According to this procedure, a residual liquid and metal components in the preparation tank 1 or in the respective pipes is cleaned and removed. Incidentally, at the procedure of the step (b), it is preferred that a filter for manufacturing may be installed at the filtering machine 4 for the purpose of heightening degree of cleanliness, or the filter for manufacturing used in the step (a) is changed to other filter.

As the cleaning solution, a material containing one or more selected from the group consisting of water, an organic solvent, an acidic solvent and a basic solvent is preferably used, in particular, water solely, or a cleaning solution containing an organic solvent is frequently used.

The organic solvent may be exemplified by, for example, an alcohol such as methanol, ethanol, propanol, butanol, methoxyethanol, butoxyethanol, methoxypropanol and ethoxypropanol; a ketone such as acetone, methyl ethyl ketone and cyclohexanone; an ether such as tetrahydrofuran, dioxane, ethylene glycol dimethyl ether, diethylene glycol dimethyl ether and propylene glycol ethyl ether; an ester such as ethyl acetate, butyl acetate, ethyl lactate, ethyl cellosolve acetate, propylene glycol methyl ether acetate and γ-butyrolactone; an aromatic compound such as benzene, toluene and xylene; and a chlorinated hydrocarbon such as dichloromethane, dichloroethane, dichloroethylene and trichloroethylene, and preferably an alcohol such as methanol, ethanol, propanol, butanol, methoxyethanol, butoxyethanol, methoxypropanol and ethoxypropanol; a ketone such as acetone, methyl ethyl ketone and cyclohexanone; an ether such as tetrahydrofuran, dioxane, ethylene glycol dimethyl ether, diethylene glycol dimethyl ether and propylene glycol ethyl ether; and an ester such as ethyl acetate, butyl acetate, ethyl lactate, ethyl cellosolve acetate, propylene glycol methyl ether acetate and γ-butyrolactone can be used.

Also, a material in which water is contained in the above-mentioned organic solvent may be used as a cleaning solution. When water is contained therein, the cleaning of a water-soluble component(s), etc., which is/are difficulty removed by cleaning only with an organic solvent alone can be promoted.

Further, a volatile acid, a base and/or a surfactant may be added to a cleaning solution comprising any of an organic solvent, a mixed solvent of an organic solvent and water, or water as an additive. By adding such an additive, a solid material or metal components which cannot be removed only by an organic solvent or water is peeled off from a surface of the apparatus such as the manufacturing apparatus, etc., whereby the cleaning can be promoted.

Next, in step (c), the cleaning solution is taken out from the manufacturing apparatus 10.

Illustrative example of the method for taking out the cleaning solution from the manufacturing apparatus 10 shown in FIG. 2 includes a method for taking out the cleaning solution by releasing the draw-off valve V2 and a method for collecting the cleaning solution from the feeding port 6 of the preparation tank 1.

Next, in step (d), the cleaning solution taken out is analyzed and a concentration of the metal components is calculated.

The metal components are materials contained in the cleaning solution which was used for cleaning the manufacturing apparatus for a resist composition, and may be mentioned a material derived from the respective equipment of the manufacturing apparatus and a material derived from an environment out of the apparatus flown into the apparatus in the previous manufacture. Illustrative examples thereof may be mentioned iron, chromium, nickel, sodium, magnesium, aluminum, potassium, calcium, copper and zinc.

At this time, the less concentration of the metal components in the cleaning solution used for cleaning the manufacturing apparatus shows the higher cleaning degree, but it is actually extremely difficult to make the concentration thereof zero, so that it is substantially 5 ppb or less, in particular, preferably the total of iron, chromium and nickel, which are materials likely causing effects on generation of defects in the etching process, to be 2 ppb or less. If the concentration of the metal components are 5 ppb or less, a resist composition lowered in coating defects than the conventional ones can be obtained.

In the present invention, for analyzing the cleaning solution, it is preferred to calculate the concentrations of the metal components by using any of an inductively coupled plasma mass spectrometer (ICP-MS), an inductively coupled plasma atomic emission spectrometer (ICP-AES) and an atomic absorption spectrometer (AAS) as a detector. The precision when any of the ICP-MS, ICP-AES and AAS is used as a detector is 0.01 ppb which can be calculated the amount precisely, whereby these can be suitably used as a method for confirming the cleaning degree in the analysis of the cleaning solution in the present invention.

When the concentration of the metal components calculated in the step (d) is greater than 5 ppb (>5 ppb), cleaning with a cleaning solution of the step (b), taking out of the cleaning solution of the step (c), and analyzing the cleaning solution (calculating the concentration of the metal components) of the step (d) are performed again. The steps are repeated until the concentration of the metal components becomes 5 ppb or less. When the concentration of the metal components are 5 ppb or less (≤5 ppb), the method can proceed to the next step (e).

In the step (e), manufacture of a resist composition is performed in the manufacturing apparatus thus cleaned. Starting materials of the resist composition are fed to the preparation tank 1 from the feeding port 6, mixed, and uniformized to prepare the composition.

The process for manufacturing a resist composition of the present invention can be applied to any of a resist compositions to be used for lithography, and in particular, it can be suitably used for manufacture of an organic resist composition for forming an organic under layer film or a silicon-containing resist composition for forming a silicon-containing resist under layer film.

As the organic resist composition among these, an organic resist composition having an aromatic compound containing at least one of a phenol derivative, a naphthalene derivative, a naphthol derivative, an anthracene derivative and a pyrene derivative as a repeating unit is preferred, and those containing a compound obtained by reacting a phenol derivative, a naphthol derivative or both of them with an aldehyde derivative, and a solvent are particularly preferred. Such an organic resist composition may be specifically exemplified by those as disclosed in Japanese Patent Laid-Open Publication No. 2012-145897, Japanese Patent Laid-Open Publication No. 2013-253227, etc.

Also, as the silicon-containing resist composition, those containing a polysiloxane are preferred, and those in which a silicon content is 10% by weight or more are particularly preferred. Such a silicon-containing resist composition may be specifically exemplified by those as disclosed in Japanese Patent No. 4716037, etc.

The prepared resist composition may be filtered to remove alien substances by passing through the filtering machine 4 at which a filter has been installed.

A pore size of the filter for manufacturing can be optionally selected depending on the degree of cleanliness required for the product (the resist composition). For example, when the coating defects are required to be lowered, those having a pore size of 20 nm or less may be used, and when higher cleanliness is required, those having a pore size of 10 nm or less may be used.

Illustrative example of a material of the filter for manufacturing includes fluorocarbon, cellulose, nylon, polyester, hydrocarbon, etc., and a filter formed by fluorocarbon known as Teflon (registered trademark), hydrocarbon such as polyethylene and polypropylene, and nylon is preferably used in the filtrating process of the resist composition.

Thereafter, the draw-off valve V2 is opened to feed the prepared and filtered resist composition to the product container 5 to complete the manufacturing step of the resist composition. Incidentally, the degree of cleanliness of the resist composition may be inspected before it is fed to the product container 5, if necessary.

When such a process for manufacturing a resist composition is employed, the degree of cleanliness in the manufacturing apparatus can be accurately measured than the conventional method, and by cleaning the manufacturing apparatus until an amount of the metal components in the cleaning solution becomes a certain amount or less, the metal components in the manufacturing apparatus can be certainly cleaned and removed, whereby a resist composition lowered in coating defects can be manufactured.

The present invention also provides a patterning process for forming a pattern on a body to be processed using a resist composition manufactured by the above-mentioned process for manufacturing a resist composition, the patterning process comprising: forming an organic under layer film on a body to be processed using an organic resist composition manufactured by the manufacturing process; forming a silicon-containing resist under layer film on the organic under layer film using a silicon-containing resist composition manufactured by the manufacturing process; forming a resist upper layer film on the silicon-containing resist under layer film; forming a pattern to the resist upper layer film; subjecting to pattern transfer to the silicon-containing resist under layer film using the resist upper layer film to which the pattern has been formed as a mask; subjecting to pattern transfer to the organic under layer film using the silicon-containing resist under layer film to which the pattern has been transferred as a mask; and subjecting to pattern transfer to the body to be processed using the organic under layer film to which the pattern has been transferred as a mask.

As the body to be processed, a semiconductor substrate or a material in which any of a metal film, a metal carbide film, a metal oxide film, a metal nitride film, a metal oxycarbide film or a metal oxynitride film is formed as a layer to be processed (a portion to be processed) on the semiconductor substrate, etc., may be used.

As the semiconductor substrate, a silicon substrate is generally used, but it is not particularly limited, and a material such as Si, amorphous silicon (α-Si), p-Si, $SiO_2$, SiN, SiON, W, TiN, Al, etc., and different in the material from the layer to be processed may be used.

Also, as a metal constituting the body to be processed (including the semiconductor substrate), any of silicon, titanium, tungsten, hafnium, zirconium, chromium, germanium, copper, aluminum, indium, gallium, arsenic, palladium, iron, tantalum, iridium or molybdenum, or an alloy thereof may be used, and as the layer to be processed containing such a metal may be used, for example, Si, $SiO_2$, SiN, SiON, SiOC, p-Si, α-Si, TiN, WSi, BPSG, SOG, Cr, CrO, CrON, MoSi, W, W—Si, Al, Cu, Al—Si, etc., and various low dielectric films and an etching stopper film thereof, which can be generally formed with a thickness of 50 to 10,000 nm, particularly 100 to 5,000 nm.

The organic resist composition which is manufactured by the manufacturing process is preferably a material having an aromatic compound containing at least one of a phenol derivative, a naphthalene derivative, a naphthol derivative, an anthracene derivative and a pyrene derivative as a repeating unit, and is particularly preferably a material comprising a compound obtained by reacting a phenol derivative, a naphthol derivative or both of them with an aldehyde derivative, and a solvent.

Such an organic resist composition can be coated on a body to be processed to form an organic under layer film by using a spin coating method, etc. Also, when a resist upper layer film is subjected to patterning by exposure, it is preferred that the organic under layer film has a sufficient function as the antireflective film. By forming such an organic under layer film, a pattern formed at the resist upper layer film can be transferred onto the body to be processed without causing difference in size conversion.

The silicon-containing resist composition which is a material manufactured by the manufacturing process is preferably a material containing a polysiloxane, and is particularly preferably a material in which a silicon content is 10% by weight or more.

Such a silicon-containing resist composition can be coated on an organic under layer film to form a film by using a spin coating method, etc. When it is formed by the spin-coating method, it is desirable to bake the material after spin-coating, to promote the cross-linking reaction for the purpose of evaporating the solvent and preventing mixing with the resist upper layer film. The baking temperature is preferably in the range of 50 to 500° C., and the baking time is preferably in the range of 10 to 300 seconds. At this time, the temperature is particularly preferably 400° C. or less to reduce thermal damage to the device, though it is depending on the structure of the device to be manufactured.

Further, in the patterning process of the present invention, as a method for forming a pattern to the resist upper layer film, any of the methods selected from a lithography method using light having a wavelength of 300 nm or less or EUV light, an electron beam direct drawing method, a directed self-assembly method (the so-called DSA method) and a nano-imprinting lithography method may be suitably used. By using such a method, a fine pattern can be formed on the resist upper layer film.

In addition, the above-mentioned manufacturing process may be applied to a composition for forming a resist upper layer film, if necessary. The resist upper layer film composition may be optionally selected depending on the above-mentioned method of forming a pattern to the resist upper layer film. For example, when lithography using light of 300 nm or less or EUV light is carried out, a chemically amplified photoresist film composition can be used as the resist upper layer film composition. Such a photoresist film material may be exemplified by a material in which a positive pattern is formed by forming a photoresist film, exposing the same, and dissolving the exposed portion using an alkaline developing solution, or a material in which a negative pattern is formed by dissolving an unexposed portion using a developing solution comprising an organic solvent.

When the exposure process in the present invention is to be made an exposure process using ArF excimer laser light, for example, as the photoresist film at the upper layer, any of the usual resist compositions for ArF excimer laser light may be used. Many candidates have already been known as the resist compositions for ArF excimer laser light. When the already known resins are roughly classified, there are a poly(meth)acrylic series, a COMA (Cyclo Olefin Maleic Anhydride) series, a COMA-(meth)acrylic hybrid series, an ROMP (Ring Opening Metathesis Polymerization) series, a polynorbornen series, etc. Among these, the resist composition using the poly(meth)acrylic series resin assures etching resistance thereof by introducing an alicyclic skeleton at the side chain, so that its resolution performance is excellent as compared to that of the other resin series, whereby it can be preferably used.

When such a patterning process is employed, coating defects of the organic under layer film and the silicon-containing resist under layer film are extremely low, so that etching defects at the time of pattern transfer in the etching process can be lowered. Accordingly, when a semiconductor apparatus is manufactured by using the same, electric abnormality such as open abnormality, short-circuit abnormality, etc., in the circuit can be lowered. In addition, when such a patterning process is employed, it can be suitably used for liquid immersion exposure, double patterning, organic solvent development, etc., and finally, yield of manufacturing a semiconductor apparatus can be improved.

EXAMPLES

In the following, the present invention is explained in more detail by referring to Cleaning Examples, Comparative Cleaning Examples, Examples and Comparative Examples, but the present invention is not limited by these.

Cleaning Example 1

The manufacturing apparatus 10 shown in FIG. 2 was cleaned by the following manner. A filter cartridge made of a polyethylene having a pore size of 20 nm was set to a filtering machine 4, and then, 20 L of propylene glycol methyl ether acetate (hereinafter referred to as PGMEA) was fed from a feeding port 6 of 100 L of a preparation tank 1 as a cleaning solution. After stirring the solution with a stirrer 2 for one hour, the stirrer 2 was stopped, a tank valve V1 and a circulation valve V3 were opened and a draw-off valve V2 was closed, and a liquid feeding pump 3 was started to circulate PGMEA for 24 hours. The PGMEA was discharged out of the apparatus by opening the draw-off valve V2. The same operation was repeated once again, and the PGMEA was captured by a clean glass bottle when it is discharged out of the apparatus. A concentration of metal components in the captured PGMEA was measured and calculated by using 7700s (ICP-MS) manufactured by Agilent Technologies, Inc.

Cleaning Example 2

Cleaning was carried out in the same manner as in Cleaning Example 1 and using the apparatus with the same constitution as in Cleaning Example 1 except for changing the pore size of the filter cartridge made of a polyethylene to be set to the filtering machine 4 to 10 nm, and then, a concentration of the metal components was measured and calculated.

Cleaning Example 3

Cleaning was carried out in the same manner as in Cleaning Example 1 and using the apparatus with the same constitution as in Cleaning Example 1 except for changing a pore size of the filter cartridge made of a polyethylene to be set to the filtering machine 4 to 3 nm, and then, a concentration of the metal components was measured and calculated.

Cleaning Example 4

Cleaning was carried out in the same manner as in Cleaning Example 1 and using the apparatus with the same constitution as in Cleaning Example 1 except for changing the filter cartridge to be set to the filtering machine 4 to a filter cartridge made of nylon having a pore size of 10 nm, and then, a concentration of the metal components was measured and calculated.

Cleaning Example 5

Cleaning was carried out in the same manner as in Cleaning Example 1 and using the apparatus with the same constitution as in Cleaning Example 1 except for changing the filter cartridge to be set to the filtering machine 4 to a filter cartridge made of Teflon (Registered Trademark) having a pore size of 20 nm, and then, a concentration of the metal components was measured and calculated.

Cleaning Example 6

Cleaning was carried out in the same manner as in Cleaning Example 1 and using the apparatus with the same constitution as in Cleaning Example 1 except for changing the cleaning solution to propylene glycol methyl ether (hereinafter referred to as PGME), and then, a concentration of the metal components was measured and calculated.

Comparative Cleaning Example 1

The manufacturing apparatus 10 with the same constitution as in Cleaning Example 1 was used, and cleaning with PGMEA was carried out once (not repeated). By using the discharged PGMEA, a concentration of the metal components was measured and calculated in the same manner as in Cleaning Example 1.

The results of the concentrations of the metal components in the cleaning solutions captured in Cleaning Examples 1 to 6 and Comparative Cleaning Example 1 are shown in Table 1.

TABLE 1

| | Analytical results of metal component concentration in cleaning solution by ICP-MS (ppb) | | | | | |
|---|---|---|---|---|---|---|
| | Cr | Fe | Ni | Cr + Fe + Ni | Other metal components | Total concentration of metal components |
| Cleaning Example 1 | 0.3 | 1.1 | 0.2 | 1.6 | 1.4 | 3.0 |
| Cleaning Example 2 | 0.2 | 1.4 | 0.4 | 2.0 | 0.9 | 2.9 |
| Cleaning Example 3 | 0.3 | 1.2 | 0.3 | 1.8 | 1.6 | 3.4 |
| Cleaning Example 4 | 0.3 | 1.4 | 0.3 | 2.0 | 2.2 | 4.2 |
| Cleaning Example 5 | 0.4 | 0.6 | 0.4 | 1.4 | 2.5 | 3.9 |
| Cleaning Example 6 | 0.3 | 1.5 | 0.2 | 2.0 | 2.2 | 4.2 |
| Comparative Cleaning Example 1 | 0.6 | 1.5 | 0.9 | 3.0 | 7.4 | 10.4 |

The other metal components denote Na, Mg, Al, K, Ca, Cu and Zn.

Next, into the manufacturing apparatus 10 each prepared in Cleaning Examples 1 to 6 and Comparative Cleaning Example 1 were added 16 kg of a PGEE solution containing 10% by weight of a polysiloxane having the composition shown below, 64 kg of PGEE and 8 kg of deionized water, and the mixture was stirred for one hour. Then, the stirrer 2 was stopped, the tank valve V1 and the circulation valve V3 were opened and the draw-off valve V2 was closed, and the liquid feeding pump 3 was started to carry out circulation filtration for 176 hours with a flow rate of 10 kg per hour. The obtained silicon-containing resist compositions were each filled in a clean glass bottle by opening the draw-off valve V2 as compositions S1-1 to 6 and S1-7, respectively.

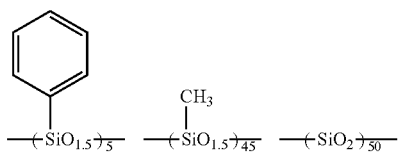

Further, into the manufacturing apparatus 10 each prepared in Cleaning Examples 1 to 6 and Comparative Cleaning Example 1 were added 36 kg of a PGMEA solution containing 20% by weight of a phenol compound having the composition shown below, 44 kg of PGMEA and an acid generator AC, and the mixture was stirred for one hour. Then, the stirrer 2 was stopped, the tank valve V1 and the circulation valve V3 were opened and the draw-off valve V2 was closed, and the liquid feeding pump 3 was started to carry out circulation filtration for 144 hours with a flow rate of 10 kg per hour. The obtained organic resist compositions were each filled in a clean glass bottle by opening the draw-off valve V2 as compositions S2-1 to 6 and S2-7, respectively.

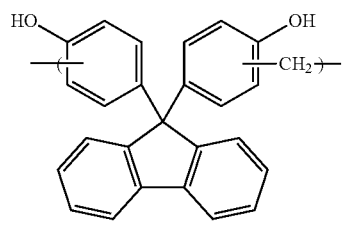

Moreover, into the manufacturing apparatus 10 each prepared in Cleaning Examples 1 to 6 and Comparative Cleaning Example 1 were added 36 kg of a PGMEA solution containing 20% by weight of a naphthol compound having the composition shown below, 44 kg of PGMEA and an acid generator AG, and the mixture was stirred for one hour. Then, the stirrer 2 was stopped, the tank valve V1 and the circulation valve V3 were opened and the draw-off valve V2 was closed, and the liquid feeding pump 3 was started to carry out circulation filtration for 144 hours with a flow rate of 10 kg per hour. The obtained organic resist compositions were each filled in a clean glass bottle by opening the draw-off valve V2 as compositions S3-1 to 6 and S3-7, respectively.

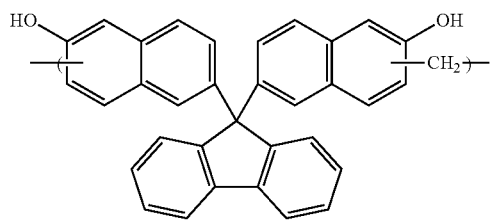

Furthermore, into the manufacturing apparatus 10 each prepared in Cleaning Examples 1 to 6 and Comparative Cleaning Example 1 were added 36 kg of a PGMEA solution containing 20% by weight of a phenol compound having the composition shown below, 44 kg of PGMEA and an acid generator AG, and the mixture was stirred for one hour. Then, the stirrer 2 was stopped, the tank valve V1 and the circulation valve V3 were opened and the draw-off valve V2 was closed, and the liquid feeding pump 3 was started to carry out circulation filtration for 144 hours with a flow rate of 10 kg per hour. The obtained organic resist compositions were each filled in a clean glass bottle by opening the draw-off valve V2 as compositions S4-1 to 6 and S4-7, respectively.

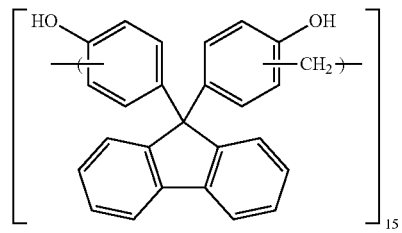

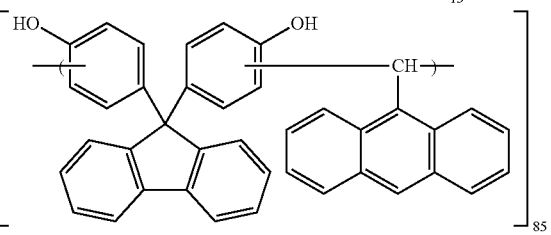

Also, into the manufacturing apparatus 10 each prepared in Cleaning Examples 1 to 6 and Comparative Cleaning Example 1 were added 36 kg of a PGMEA solution containing 20% by weight of a naphthol compound having the composition shown below, 44 kg of PGMEA and an acid generator AG, and the mixture was stirred for one hour. Then, the stirrer 2 was stopped, the tank valve V1 and the circulation valve V3 were opened and the draw-off valve V2 was closed, and the liquid feeding pump 3 was started to carry out circulation filtration for 144 hours with a flow rate of 10 kg per hour. The obtained organic resist compositions were each filled in a clean glass bottle by opening the draw-off valve V2 as compositions S5-1 to 6 and S5-7, respectively.

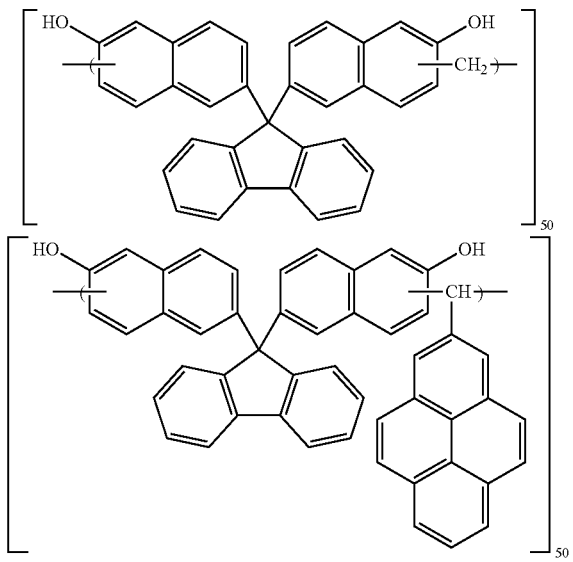

Patterning Test

On a silicon wafer on which a silicon nitride film with a film thickness of 100 nm had been formed were each coated S2-1 to 7, S3-1 to 7, S4-1 to 7 and S5-1 to 7, and heated at 350° C. for 60 seconds to prepare organic under layer films with a film thickness of 200 nm, respectively. Next, S1-1 to 7 were each coated thereon and heated at 240° C. for 60 seconds to prepare silicon-containing resist under layer films with a film thickness of 35 nm, respectively. Subsequently, the ArF resist solution (PR-1) for positive development shown in Table 2 was coated thereon, and baked at 110° C. for 60 seconds to prepare photoresist films with a film thickness of 100 nm. Further, the liquid immersion top coat (TC-1) shown in Table 3 was coated on the respective photoresist films, and baked at 90° C. for 60 seconds to form a top coat with a film thickness of 50 nm.

Next, these were exposed by an ArF liquid immersion exposure apparatus (NSR-S610C manufactured by Nikon Corporation, NA: 1.30, σ: 0.98/0.65, 35° polarized dipole illumination, 6% halftone phase shift mask), baked at 100° C. for 60 seconds (PEB), and developed by a 2.38% by mass tetramethylammonium hydroxide (TMAH) aqueous solution for 30 seconds to obtain 43 nm 1:1 positive line and space pattern.

Pattern collapse was measured by an electron microscope (CG4000) manufactured by Hitachi High-Technologies Corporation, and cross sectional shapes were measured by an electron microscope (S-4700) manufactured by Hitachi, Ltd. (Table 4).

TABLE 2

| Polymer No. | (parts by mass) | Acid generator (parts by mass) | Base (parts by mass) | Solvent (parts by mass) |
|---|---|---|---|---|
| PR-1 | ArF resist polymer 1 (100) | PAG1 (7.0) | Quencher (1.0) | PGMEA (2,500) |

ArF resist polymer 1:
Molecular weight (Mw) = 7,800
Dispersity (Mw/Mn) = 1.78

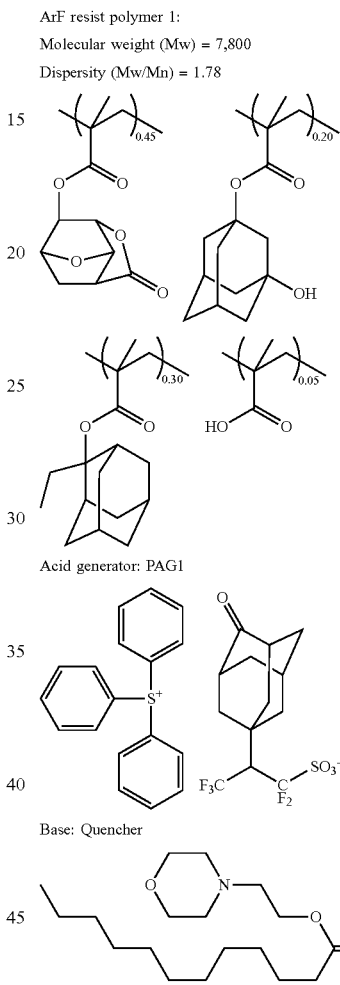

Acid generator: PAG1

Base: Quencher

TABLE 3

| Polymer (parts by mass) | Organic solvent (parts by mass) |
|---|---|
| TC-1 Top coat polymer (100) | Diisoamyl ether (2,700) 2-Methyl-1-butanol (270) |

Top coat polymer
Molecular weight (Mw) = 8,800
Dispersity (Mw/Mn) = 1.69

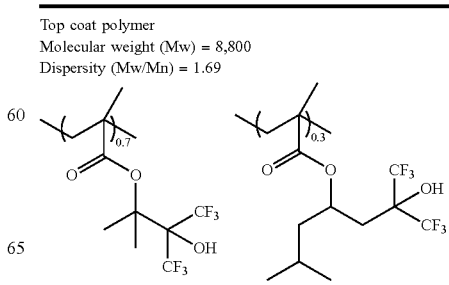

TABLE 4

| Example | Organic under layer film | Silicon-containing resist under layer film | ArF resist | Cross sectional shape of pattern after development | Pattern collapse |
|---|---|---|---|---|---|
| Example 1 | S2-1 | S1-1 | PR-1 | Perpendicular shape | None |
| Example 2 | S2-2 | S1-1 | PR-1 | Perpendicular shape | None |
| Example 3 | S2-3 | S1-1 | PR-1 | Perpendicular shape | None |
| Example 4 | S2-4 | S1-1 | PR-1 | Perpendicular shape | None |
| Example 5 | S2-5 | S1-2 | PR-1 | Perpendicular shape | None |
| Example 6 | S2-6 | S1-2 | PR-1 | Perpendicular shape | None |
| Example 7 | S3-1 | S1-2 | PR-1 | Perpendicular shape | None |
| Example 8 | S3-2 | S1-2 | PR-1 | Perpendicular shape | None |
| Example 9 | S3-3 | S1-3 | PR-1 | Perpendicular shape | None |
| Example 10 | S3-4 | S1-3 | PR-1 | Perpendicular shape | None |
| Example 11 | S3-5 | S1-3 | PR-1 | Perpendicular shape | None |
| Example 12 | S3-6 | S1-3 | PR-1 | Perpendicular shape | None |
| Example 13 | S4-1 | S1-4 | PR-1 | Perpendicular shape | None |
| Example 14 | S4-2 | S1-4 | PR-1 | Perpendicular shape | None |
| Example 15 | S4-3 | S1-4 | PR-1 | Perpendicular shape | None |
| Example 16 | S4-4 | S1-4 | PR-1 | Perpendicular shape | None |
| Example 17 | S4-5 | S1-5 | PR-1 | Perpendicular shape | None |
| Example 18 | S4-6 | S1-5 | PR-1 | Perpendicular shape | None |
| Example 19 | S5-1 | S1-5 | PR-1 | Perpendicular shape | None |
| Example 20 | S5-2 | S1-5 | PR-1 | Perpendicular shape | None |
| Example 21 | S5-3 | S1-6 | PR-1 | Perpendicular shape | None |
| Example 22 | S5-4 | S1-6 | PR-1 | Perpendicular shape | None |
| Example 23 | S5-5 | S1-6 | PR-1 | Perpendicular shape | None |
| Example 24 | S5-6 | S1-6 | PR-1 | Perpendicular shape | None |
| Comparative Example 1 | S2-1 | S1-7 | PR-1 | Perpendicular shape | None |
| Comparative Example 2 | S3-1 | S1-7 | PR-1 | Perpendicular shape | None |
| Comparative Example 3 | S2-7 | S1-1 | PR-1 | Perpendicular shape | None |
| Comparative Example 4 | S3-7 | S1-2 | PR-1 | Perpendicular shape | None |
| Comparative Example 5 | S4-7 | S1-7 | PR-1 | Perpendicular shape | None |
| Comparative Example 6 | S5-7 | S1-7 | PR-1 | Perpendicular shape | None |

There were no problem in the results which were subjected to patterning the photoresist film using the resist composition manufactured on any of the cleaning conditions.

Pattern Etching Test

The resist pattern manufactured by the above-mentioned patterning test was used as a mask and processing of the silicon-containing resist under layer film was carried out by dry etching under the condition (1), then, by dry etching under the condition (2) to transfer the pattern to the organic under layer film, further, by dry etching under the condition (3) to transfer the pattern to the silicon nitride film. The cross sectional shapes of the obtained patterns were observed by an electron microscope (S-9380) manufactured by Hitachi, Ltd., and pattern defects were observed by a bright-field defect detecting apparatus KLA2800 manufactured by KLA-Tencor Corporation, and the results were summarized in Table 5.

(1) Etching Conditions in $CHF_3/CF_4$ Type Gas
Device: Dry etching device Telius SP manufactured by Tokyo Electron Limited
Etching Conditions (1):

| Chamber pressure | 15 Pa |
|---|---|
| Upper/Lower RF power | 500 W/300 W |
| $CHF_3$ gas flow amount | 50 ml/min |
| $CF_4$ gas flow amount | 150 ml/min |
| Treatment time | 40 sec |

Etching Conditions (2):

| Chamber pressure | 2 Pa |
|---|---|
| Upper/Lower RF power | 1000 W/300 W |
| $CO_2$ gas flow amount | 320 ml/min |
| $N_2$ gas flow amount | 80 ml/min |
| Treatment time | 30 sec |

Etching Conditions (3):

| Chamber pressure | 20 Pa |
|---|---|
| Upper/Lower RF power | 500 W/300 W |
| $CHF_3$ gas flow amount | 30 ml/min |
| $CF_4$ gas flow amount | 170 ml/min |
| Treatment time | 40 sec |

TABLE 5

| Example | Cross sectional shape of silicon nitride | Number of defects |
|---|---|---|
| Example 1 | Perpendicular shape | 15 |
| Example 2 | Perpendicular shape | 18 |
| Example 3 | Perpendicular shape | 13 |
| Example 4 | Perpendicular shape | 16 |
| Example 5 | Perpendicular shape | 14 |
| Example 6 | Perpendicular shape | 13 |
| Example 7 | Perpendicular shape | 16 |
| Example 8 | Perpendicular shape | 13 |

TABLE 5-continued

| Example | Cross sectional shape of silicon nitride | Number of defects |
|---|---|---|
| Example 9 | Perpendicular shape | 13 |
| Example 10 | Perpendicular shape | 17 |
| Example 11 | Perpendicular shape | 17 |
| Example 12 | Perpendicular shape | 16 |
| Example 13 | Perpendicular shape | 19 |
| Example 14 | Perpendicular shape | 17 |
| Example 15 | Perpendicular shape | 15 |
| Example 16 | Perpendicular shape | 15 |
| Example 17 | Perpendicular shape | 18 |
| Example 18 | Perpendicular shape | 13 |
| Example 19 | Perpendicular shape | 16 |
| Example 20 | Perpendicular shape | 17 |
| Example 21 | Perpendicular shape | 15 |
| Example 22 | Perpendicular shape | 18 |
| Example 23 | Perpendicular shape | 13 |
| Example 24 | Perpendicular shape | 16 |
| Comparative Example 1 | Perpendicular shape | 42 |
| Comparative Example 2 | Perpendicular shape | 36 |
| Comparative Example 3 | Perpendicular shape | 45 |
| Comparative Example 4 | Perpendicular shape | 42 |
| Comparative Example 5 | Perpendicular shape | 71 |
| Comparative Example 6 | Perpendicular shape | 68 |

From the results mentioned above, Examples 1 to 24 using the silicon-containing resist composition and the organic resist composition manufactured by the manufacturing apparatus for which cleaning had been repeated until a concentration of the metal components in the cleaning solution becomes 5 ppb or less showed the number of the defects of less than 20. On the other hand, Comparative Examples 5 and 6 in which both of the silicon-containing resist composition and the organic resist composition manufactured by the conventional method had been used showed the number of the defects of 60 or more. Also, Comparative Examples 1 and 2 in which the silicon-containing resist composition manufactured by the manufacturing process of the present invention and the organic resist composition manufactured by the conventional method had been used, and Comparative Examples 3 and 4 in which the silicon-containing resist composition manufactured by the conventional method and the organic resist composition manufactured by the manufacturing process of the present invention had been used showed the number of the defects of around 40, which were less number of the defects than that of Comparative Examples 5 and 6 in which the resist compositions manufactured only by the conventional methods had been used, but were larger number of the defects of Examples 1 to 24 in which the resist compositions manufactured only by the manufacturing process of the present invention had been used.

From the results mentioned above, it could be clarified that if the resist compositions manufactured by the process for manufacturing a resist composition of the present invention were used, etching defects could be lowered than the use of the conventional method, but in the multi-layer resist method, if the resist composition obtained by the conventional method was used in combination with the resist composition obtained by the present invention, lowering effects in etching defects were slightly lowered. In addition, in the multi-layer resist method, it could be clarified when the resist compositions to be used were all the materials manufactured by the manufacturing process of the present invention, etching defects could be markedly lowered.

Accordingly, when the patterning process using the resist composition manufactured by the process for manufacturing a resist composition of the present invention is employed, it would be clarified that etching defects at the time of pattern transfer could be lowered, and it would be suggested that yield in manufacturing a semiconductor apparatus could be improved.

It must be stated here that the present invention is not restricted to the embodiments shown by the embodiments. The embodiments are merely examples so that any embodiments composed of substantially the same technical concept as disclosed in the claims of the present invention and expressing a similar effect are included in the technical scope of the present invention.

What is claimed is:

1. A process for manufacturing a resist under layer film-forming composition adapted for use in a manufacturing process of a semiconductor apparatus, comprising the steps of:
cleaning a manufacturing apparatus, including a preparation tank, a pipe, a pump, a filtering machine, and a valve, for the resist under layer film-forming composition by circulating a cleaning solution through the preparation tank, the pipe, the pump, the filtering machine, and the valve;
analyzing the cleaning solution taken out from the manufacturing apparatus;
repeating the step of cleaning by circulating a cleaning solution and the step of analyzing until a concentration of metal components contained in the cleaning solution becomes 5 ppb or less;
discharging the cleaning solution out of the manufacturing apparatus;
feeding a starting material of the resist under layer film-forming composition to the preparation tank, followed by mixing and uniformizing to prepare the resist under layer film- forming composition;
filtering the prepared resist under layer film-forming composition, followed by feeding the filtered resist under layer film-forming composition to a product container.

2. The process according to claim 1, wherein the concentration of the metal components is calculated by using any of an inductively coupled plasma mass spectrometer, an inductively coupled plasma atomic emission spectrometer and an atomic absorption spectrometer in analyzing the cleaning solution.

3. The process according to claim 1, wherein the step of cleaning by circulation is performed until a total concentration of iron, chromium and nickel among the metal components contained in the cleaning solution becomes 2 ppb or less.

4. The process according to claim 2, wherein the step of cleaning by circulation is performed until a total concentration of iron, chromium and nickel among the metal components contained in the cleaning solution becomes 2 ppb or less.

5. The process according to claim 1, wherein the resist under layer film-forming composition is an organic resist under layer film-forming composition having an aromatic compound as a repeating unit.

6. The process according to claim 2, wherein the resist under layer film-forming composition is an organic resist under layer film-forming composition having an aromatic compound as a repeating unit.

7. The process according to claim 3, wherein the resist under layer film-forming composition is an organic resist under layer film-forming composition having an aromatic compound as a repeating unit.

8. The process according to claim 5, wherein the aromatic compound contains at least one of a phenol derivative, a naphthalene derivative, a naphthol derivative, an anthracene derivative and a pyrene derivative.

9. The process according to claim 5, wherein the organic resist under layer film-forming composition contains a compound obtained by reacting a phenol derivative, a naphthol derivative or both of them with an aldehyde derivative, and a solvent.

10. The process according to claim 1, wherein the resist under layer film-forming composition is a silicon-containing resist under layer film-forming composition.

11. The process according to claim 2, wherein the resist under layer film-forming composition is a silicon-containing resist under layer film-forming composition.

12. The process according to claim 3, wherein the resist under layer film-forming composition is a silicon-containing resist under layer film-forming composition.

13. The process according to claim 10, wherein the silicon- containing resist under layer film-forming composition contains a polysiloxane.

14. The process according to claim 10, wherein a silicon content in the silicon-containing resist under layer film-forming composition is 10% by weight or more.

15. A patterning process for forming a pattern on a body to be processed using a resist under layer film-forming composition manufactured by the process according to claim 1, the patterning process comprising:
   forming an organic under layer film on a body to be processed using an organic resist under layer film-forming composition manufactured by the process;
   forming a silicon-containing resist under layer film on the organic under layer film using a silicon-containing resist under layer film-forming composition manufactured by the process;
   forming a resist upper layer film on the silicon-containing resist under layer film;
   forming a pattern to the resist upper layer film;
   subjecting to pattern transfer to the silicon-containing resist under layer film using the resist upper layer film to which the pattern has been formed as a mask;
   subjecting to pattern transfer to the organic under layer film using the silicon- containing resist under layer film to which the pattern has been transferred as a mask; and
   subjecting to pattern transfer to the body to be processed using the organic under layer film to which the pattern has been transferred as a mask.

16. A patterning process for forming a pattern on a body to be processed using a resist under layer film-forming composition manufactured by the process according to claim 2, the patterning process comprising:
   forming an organic under layer film on a body to be processed using an organic resist under layer film-forming composition manufactured by the process;
   forming a silicon-containing resist under layer film on the organic under layer film using a silicon-containing resist under layer film-forming composition manufactured by the process;
   forming a resist upper layer film on the silicon-containing resist under layer film;
   forming a pattern to the resist upper layer film;
   subjecting to pattern transfer to the silicon-containing resist under layer film using the resist upper layer film to which the pattern has been formed as a mask;
   subjecting to pattern transfer to the organic under layer film using the silicon- containing resist under layer film to which the pattern has been transferred as a mask; and
   subjecting to pattern transfer to the body to be processed using the organic under layer film to which the pattern has been transferred as a mask.

17. The patterning process according to claim 15, wherein an organic resist under layer film-forming composition having an aromatic compound as a repeating unit is used as the organic resist under layer film-forming composition.

18. The patterning process according to claim 15, wherein a silicon-containing resist under layer film-forming composition containing a polysiloxane is used as the silicon-containing resist under layer film-forming composition.

19. The patterning process according to claim 15, wherein the body to be processed is a semiconductor substrate or a material in which any of a metal film, a metal carbide film, a metal oxide film, a metal nitride film, a metal oxycarbide film or a metal oxynitride film is formed as a film on the semiconductor substrate.

20. The patterning process according to claim 19, wherein a metal constituting the body to be processed is silicon, titanium, tungsten, hafnium, zirconium, chromium, germanium, copper, aluminum, indium, gallium, arsenic, palladium, iron, tantalum, iridium, molybdenum or an alloy of these metals.

* * * * *